(12) United States Patent
Murooka

(10) Patent No.: US 9,171,615 B2
(45) Date of Patent: Oct. 27, 2015

(54) SEMICONDUCTOR MEMORY DEVICE

(71) Applicant: Kabushiki Kaisha Toshiba, Minato-ku (JP)

(72) Inventor: Kenichi Murooka, San Jose, CA (US)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 14/334,197

(22) Filed: Jul. 17, 2014

(65) Prior Publication Data

US 2014/0328109 A1 Nov. 6, 2014

Related U.S. Application Data

(63) Continuation of application No. 13/327,065, filed on Dec. 15, 2011, now Pat. No. 8,848,418.

(30) Foreign Application Priority Data

Jan. 14, 2011 (JP) .................................. 2011-006294

(51) Int. Cl.
*G11C 11/00* (2006.01)
*G11C 13/00* (2006.01)
(Continued)

(52) U.S. Cl.
CPC ............... *G11C 13/0023* (2013.01); *G11C 8/10* (2013.01); *G11C 13/0002* (2013.01); *H01L 27/249* (2013.01); *H01L 45/04* (2013.01);
(Continued)

(58) Field of Classification Search
CPC ..................... H01L 27/11578; H01L 45/1233; H01L 27/11551; H01L 21/8221; G11C 2213/71; G06F 3/04815

USPC ........ 365/148, 163, 189.16, 230.06, 189.011, 365/230.03
See application file for complete search history.

(56) References Cited

U.S. PATENT DOCUMENTS 8,791,447 B2 * 7/2014 Liu et al. ............................ 257/5
2005/0041467 A1 * 2/2005 Chen ............................. 365/184
(Continued)

FOREIGN PATENT DOCUMENTS

| JP | 2005-522045 | 7/2005 |
| JP | 2006-302407 | 11/2006 |
| JP | 2009-4725 | 1/2009 |

OTHER PUBLICATIONS

Office Action issued on Jul. 2, 2013 in the corresponding Japanese Patent Application No. 2011-006294 (w/English translation).

*Primary Examiner* — Son Dinh
*Assistant Examiner* — Uyen B Tran
(74) *Attorney, Agent, or Firm* — Oblon, McClelland, Maier & Neustadt, L.L.P.

(57) ABSTRACT

A semiconductor memory device according to an embodiment comprises a memory cell array configured from a plurality of row lines and column lines that intersect one another, and from a plurality of memory cells disposed at each of intersections of the row lines and column lines and each including a variable resistance element. Where a number of the row lines is assumed to be N, a number of the column lines is assumed to be M, and a ratio of a cell current flowing in the one of the memory cells when a voltage that is half of the select voltage is applied to the one of the memory cells to a cell current flowing in the one of the memory cells when the select voltage is applied to the one of the memory cells is assumed to be k, a relationship $M^2 < 2 \times N \times k$ is satisfied.

21 Claims, 12 Drawing Sheets

(51) Int. Cl.
*G11C 8/10* (2006.01)
*H01L 45/00* (2006.01)
*H01L 27/24* (2006.01)

(52) U.S. Cl.
CPC .......... *H01L45/1226* (2013.01); *H01L 45/146* (2013.01); *H01L 45/147* (2013.01); *H01L 45/149* (2013.01); *G11C 2213/71* (2013.01)

(56) References Cited

U.S. PATENT DOCUMENTS

| | | |
|---|---|---|
| 2007/0262301 A1* | 11/2007 | Cowburn et al. ................ 257/40 |
| 2008/0067554 A1* | 3/2008 | Jeong et al. .................... 257/211 |
| 2008/0130352 A1 | 6/2008 | Scheuerlein |
| 2008/0159053 A1 | 7/2008 | Yan et al. |
| 2008/0173932 A1* | 7/2008 | Kidoh et al. ................... 257/324 |
| 2009/0085121 A1* | 4/2009 | Park et al. ..................... 257/368 |
| 2009/0315090 A1* | 12/2009 | Weis et al. .................... 257/296 |
| 2010/0046272 A1 | 2/2010 | Inoue |
| 2010/0176368 A1* | 7/2010 | Ko et al. ........................... 257/5 |
| 2010/0182820 A1 | 7/2010 | Kitagawa et al. |
| 2011/0122676 A1 | 5/2011 | Murooka et al. |
| 2011/0205783 A1 | 8/2011 | Murooka |
| 2011/0299321 A1 | 12/2011 | Murooka |
| 2013/0043455 A1 | 2/2013 | Bateman |

* cited by examiner

| Scaling Coefficient: $\lambda$ | |
|---|---|
| Wiring Size (Width) | $d \to \lambda d$ |
| Wiring Size (Height) | $h \to \lambda h$ |
| Cell Area | $a \to \lambda^2 a$ |
| Cell Array Number | $M \to M/\lambda$ |
| | $N \to N/\lambda$ |
| Array Area | $A \to A$ |
| Sheet Resistance | $\rho \to \rho/\lambda$ |
| Cell Current | $I_C \to \lambda^2 I_C$ |

SEMICONDUCTOR MEMORY DEVICE

CROSS-REFERENCE TO RELATED APPLICATIONS

This application is continuation of and claims the benefit of priority under 35 U.S.C. §120 from U.S. Ser. No. 13/327,065 filed Dec. 15, 2011, and claims the benefit of priority under 35 U.S.C. §119 from Japanese Patent Application No. 2011-6294 filed Jan. 14, 2011, the entire contents of each of which are incorporated herein by reference.

FIELD

The embodiments relate to a semiconductor memory device.

BACKGROUND

In recent years, LSI elements configuring semiconductor memory devices are becoming increasingly miniaturized as these semiconductor devices become more highly integrated. Such miniaturization of LSI elements requires not only a simple narrowing of line width, but also improvement in dimensional accuracy and positional accuracy of circuit patterns. Proposed as a technology for overcoming these problems is ReRAM (Resistive RAM) which is configured by memory cells that include a variable resistance element and a selection element such as a diode. A memory cell in this ReRAM does not require the use of a MOSFET and moreover can be configured as across-point type. Hence, a high degree of integration exceeding conventional trends is expected of ReRAM.

However, in cross-point type architecture, a half-select bias system is sometimes required. In this half-select bias system, a half-selected cell current flows in addition to an ordinary selected cell current. Hence, when cell size undergoes reduction scaling, voltage drop within the memory cell array does not achieve a simple proportional relationship, and it is thus difficult to keep voltage drop constant.

Furthermore, when employing the half-select bias system, the half-selected cell current also gets mixed in with the selected cell current during data read, thus making read of a selected cell difficult. When reduction scaling of cell size is performed, the proportion of this mixed-in half-selected cell current also increases, leading to problems during miniaturization of semiconductor memory devices.

DETAILED DESCRIPTION

A semiconductor memory device according to an embodiment comprises: a memory cell array configured from a plurality of row lines and column lines that intersect one another, and from a plurality of memory cells disposed at each of intersections of the row lines and column lines and each including a variable resistance element; and a decoder for applying to one of the memory cells a select voltage required in data erase/write/read. Where a number of the row lines is assumed to be N, a number of the column lines is assumed to be M, and a ratio of a cell current flowing in the one of the memory cells when a voltage that is half of the select voltage is applied to the one of the memory cells to a cell current flowing in the one of the memory cells when the select voltage is applied to the one of the memory cells is assumed to be k, a relationship $M^2 \leq 2 \times N \times k$ is satisfied.

A semiconductor memory device according to an embodiment is described below with reference to the drawings.

First Embodiment

First, an overall configuration of a semiconductor memory device according to a first embodiment is described.

Figure 1:
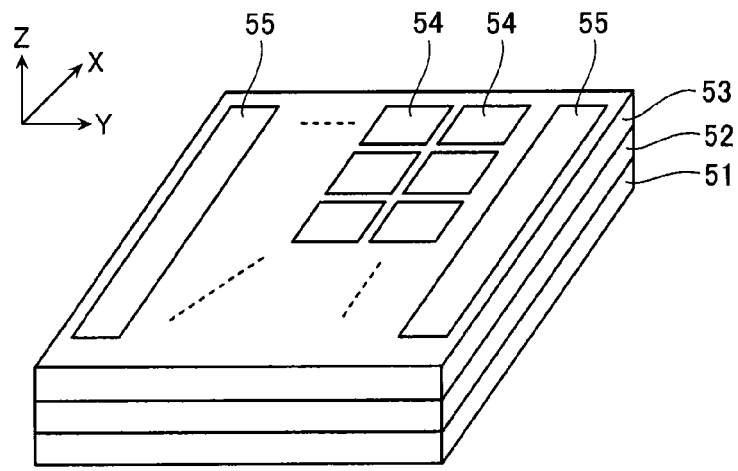
FIG. 1 is a perspective view showing an overall configuration of a semiconductor memory device according to a first embodiment.

FIG. 1 is a perspective view showing the overall configuration of the semiconductor memory device according to the first embodiment. A CMOS circuit 52 including a wiring layer is configured on an ordinary silicon (Si) substrate 51 (semiconductor substrate) by an ordinarily employed process, and a layer 53 including a plurality of memory cell units 54 is formed on the CMOS circuit 52. Each memory cell unit 54 shown in FIG. 1 corresponds to a memory cell array 11 to be described later and has wiring formed by a 24 nm design rule. Moreover, a portion which includes a driver, a decoder, and a higher block and which is called a peripheral circuit in an ordinary semiconductor memory device is included in the CMOS circuit 52.

Note that, excluding a connecting portion of the CMOS circuit 52 with the memory cell unit 54, the CMOS circuit 52 is designed and manufactured by a design rule of, for example, 90 nm which is more lenient than that of the memory cell unit 54. An electrical connecting portion with the CMOS circuit 52 (not illustrated) is provided in a periphery of each memory cell unit 54. Blocks having these memory cell unit 54 and peripheral electrical connecting portion as a unit are disposed in a matrix. Furthermore, a through hole (not illustrated) is formed in the layer 53 including the memory cell units 54. The electrical connecting portion of the memory cell unit 54 is connected to the CMOS circuit 52 via this through hole. The memory cell unit 54 has its operation controlled by the CMOS circuit 52. An input/output unit 55 includes a terminal having an electrical joint with an input/output unit of the CMOS circuit 52. These terminals are also connected to the input/output unit of the CMOS circuit 52 via the previously-mentioned through hole. Data, commands, addresses and so on required by the CMOS circuit 52 for controlling operation of the memory cell unit 54 are exchanged with external via the input/output unit 55. The input/output unit 55 is formed at an end of the layer 53 including the memory cell units 54.

The above configuration allows a portion corresponding to a protective film of the CMOS circuit 52 to serve also as an insulating film formed in the memory cell unit 54. Moreover, in the present embodiment, the fact that the memory cell unit 54 and the CMOS circuit 52 join in a stacking direction (Z direction) makes it possible to reduce operation time without any associated increase in chip area, significantly increase the number of memory cells simultaneously accessible, and so on. Note that the input/output unit 55 is bonded to a lead frame in a packaging process, similarly to an input/output unit of an ordinary semiconductor memory device.

Figure 2:
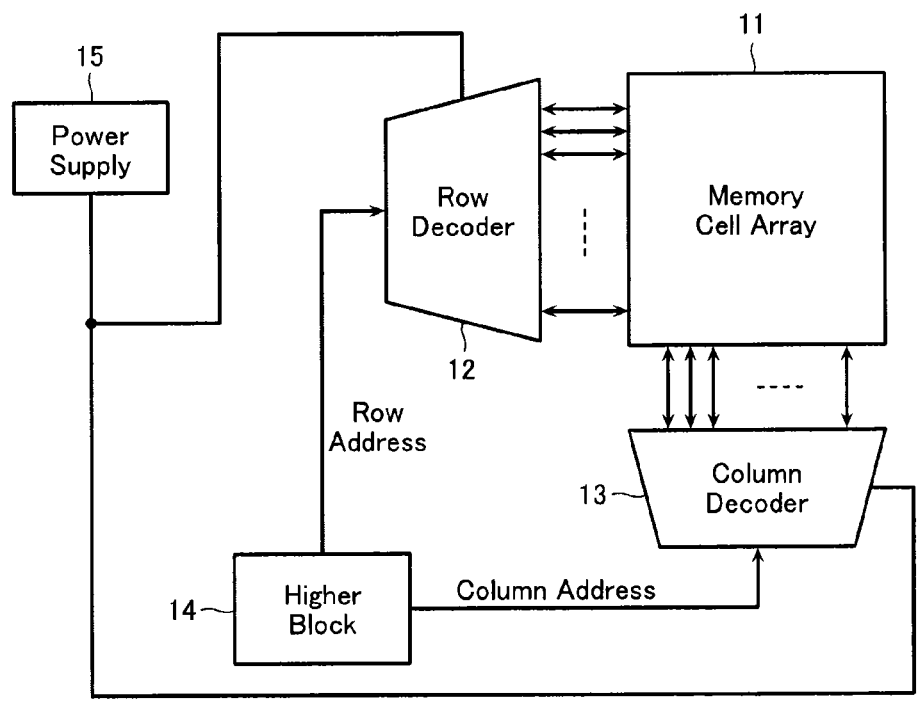
FIG. 2 is a functional block diagram of the semiconductor memory device according to the same embodiment.

Next, functional blocks of the semiconductor memory device according to the present embodiment are described with reference to FIG. 2.

This semiconductor memory device comprises the memory cell array 11 including a plurality of row lines and column lines that intersect one another, and memory cells disposed at each of intersections of these row lines and column lines. This memory cell array 11 corresponds to the memory cell unit 54 shown in FIG. 1. In the explanation below, row lines are called word lines, and column lines are called bit lines, after the example of an ordinary semiconductor memory device.

In addition, the semiconductor memory device comprises a row decoder 12 for selecting a word line and a column decoder 13 for selecting a bit line during access (data erase/write/read). The column decoder 13 includes a driver for controlling access operation.

Furthermore, the semiconductor memory device comprises a higher block 14 serving as a control circuit for selecting access target memory cells in the memory cell array 11. The higher block 14 provides a row address and a column address to, respectively, the row decoder 12 and the column decoder 13. A power supply 15 generates certain combinations of voltages corresponding to each of operations of data erase/write/read, and supplies these combinations of voltages to the row decoder 12 and column decoder 13.

The above functional blocks allow batch data erase/write/read of all memory cells connected to an identical word line. The CMOS circuit 52 shown in FIG. 1 is provided with peripheral circuits of the row decoder 12, column decoder 13, and higher block 14, and so on shown in FIG. 2.

Figure 3:
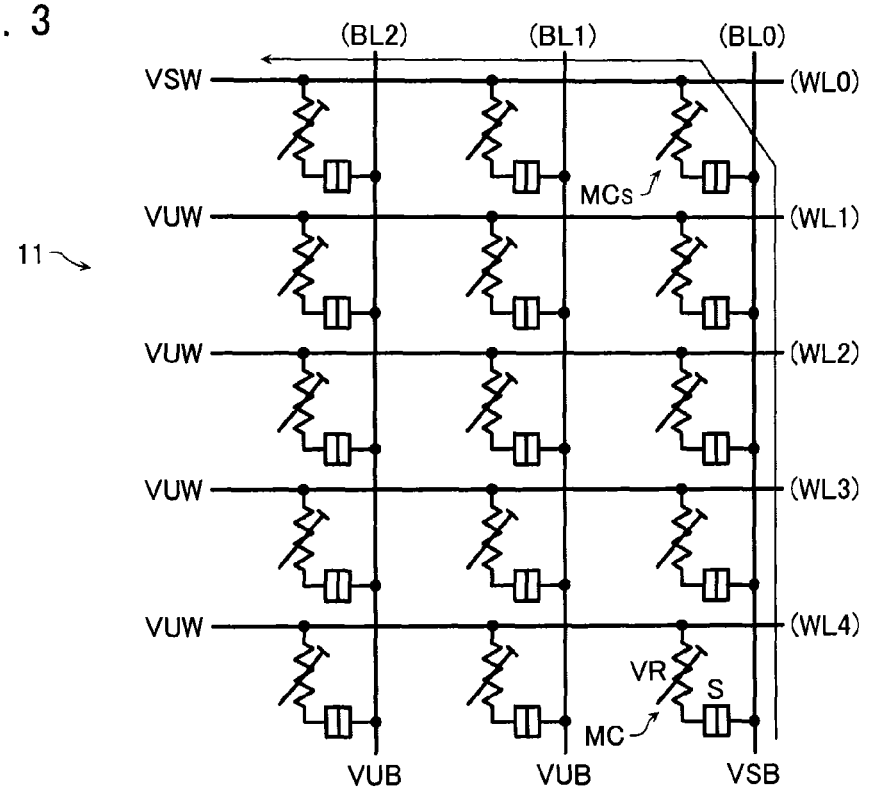
FIG. 3 is a circuit diagram of a memory cell array in the semiconductor memory device according to the same embodiment.

Next, the memory cell array 11 in the semiconductor memory device according to the present embodiment is described with reference to FIG. 3.

The memory cell array 11 has a plurality of word lines WL and bit lines BL disposed intersecting one another, and has memory cells MC formed at each of intersections of these word lines WL and bit lines BL, each of the memory cells MC including a variable resistance element VR. A selection element S is connected in series to the variable resistance element VR of the memory cell MC, and the variable resistance element VR receives supply of voltage from the word lines WL and bit lines BL via this selection element S.

As a result of the above kind of structure of the memory cell array 11, the word lines WL and bit lines BL achieve a simple line-and-space pattern, and, since, during formation of the memory cell array 11, the word lines WL and bit lines BL need only have a positional relationship of intersecting one another, there is no need to consider misalignment. In other words, since alignment accuracy of the memory cells MC may be greatly relaxed, the semiconductor memory device can be easily manufactured. Moreover, in the case of the above-described structure, one memory cell MC can be formed per $4F^2$ region, hence a high degree of integration in the semiconductor memory device can be achieved.

The row decoder 12 is connected to each word line WL of the memory cell array 11 and the column decoder 13 is connected to each bit line BL of the memory cell array 11. In addition, the row decoder 12 and column decoder 13 are supplied with certain voltages corresponding to each of operations of data erase/write/read from the power supply 15.

Access to the memory cell MC is performed by, first, the row decoder 12 and column decoder 13 selecting the word line WL and bit line BL connected to an access target selected cell $MC_S$ in the memory cell array 11, based on a row address and column address outputted by the higher block 14. In the case of FIG. 3, the row decoder 12 and column decoder 13 are arranged to select, respectively, the word line WL0 and bit line BL0.

Next, the row decoder 12 supplies a selected word line voltage VSW (selected row line voltage) to the selected word line WL (WL0 in FIG. 3), and supplies an unselected word line voltage VUW (unselected row line voltage) to other unselected word lines WL. Meanwhile, the column decoder 13 supplies a selected bit line voltage VSB (selected column line voltage) to the selected bit line BL (BL0 in FIG. 3), and supplies an unselected bit line voltage VUB (unselected column line voltage) to other unselected bit lines BL. Setting these selected word line voltage VSW, unselected word line voltage VUW, selected bit line voltage VSB, and unselected bit line voltage VUB to appropriate voltages to be described later allows access to a certain memory cell MC in the memory cell array 11.

Next, characteristics of the memory cell MC are described.

First, characteristics of the variable resistance element VR in the memory cell MC are described with reference to FIG. 4.

The variable resistance element VR is formed adopting a resistance varying material typified by, for example, $TiO_2$, as its material. This resistance varying material is a material that undergoes transition between at least two resistance values of a low-resistance state (LRS) and a high-resistance state (HRS).

Figure 4:
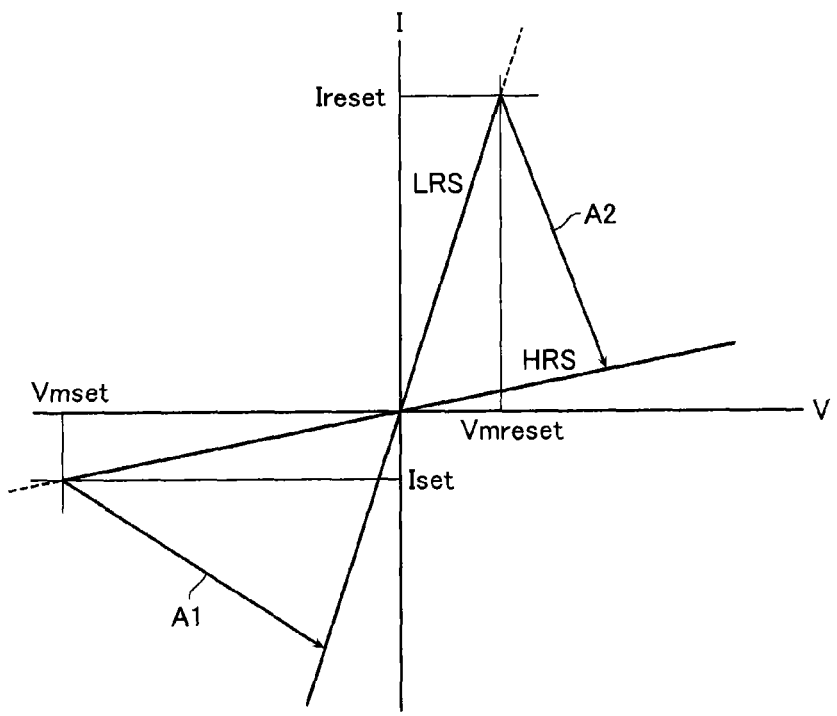
FIG. 4 is a characteristic diagram of a variable resistance element in the semiconductor memory device according to the same embodiment.

The resistance varying material in the high-resistance state, when applied with a voltage of a certain level or more (a voltage of voltage Vmset or more in a negative direction in FIG. 4), undergoes transition to the low-resistance state as shown by arrow A1 in FIG. 4. Such a transition of the resistance varying material from the high-resistance state to the low-resistance state is called a "setting operation". Data write in the present embodiment is realized by this setting operation. Note that in FIG. 4, a current flowing in the resistance varying material during start of the setting operation is shown as Iset.

On the other hand, the resistance varying material in the low-resistance state, when a current of a certain level or more (a current of current Ireset or more in FIG. 4) flows therein, undergoes transition to the high-resistance state as shown by arrow A2 in FIG. 4. Such a transition of the resistance varying material from the low-resistance state to the high-resistance state is called a "resetting operation". Data erase in the present embodiment is realized by this resetting operation. Note that in FIG. 4, a voltage applied to the resistance varying material during start of the resetting operation is shown as Vmreset.

In particular, the variable resistance element VR having the setting operation and resetting operation performed by voltage applications of different polarities as shown in FIG. 4 is called a "bipolar operation element", and is employed in the memory cell MC in combination with the selection element S to be described later.

The variable resistance element VR may be configured by a thin film having $HfO_x$, $ZnMn_2O_4$, NiO, $SrZrO_3$, $Pr_{0.7}Ca_{0.3}MnO_3$, carbon, and so on, as its material, as an alternative to $TiO_2$.

Next, characteristics of the selection element S in the memory cell MC are described with reference to FIGS. 5A and 5B.

Figure 5A:
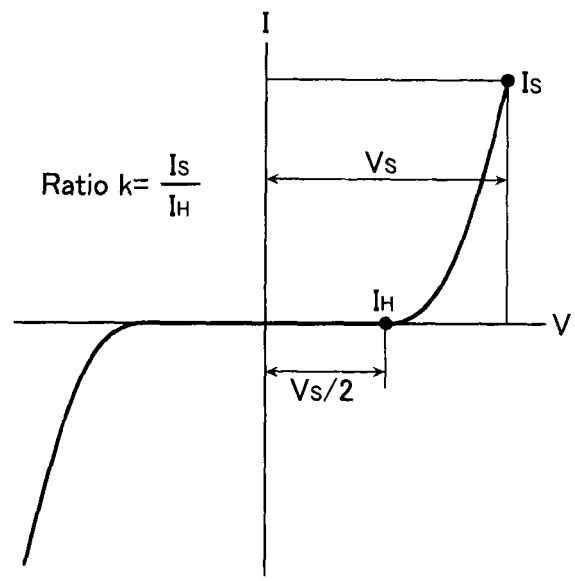
FIG. 5A is a characteristic diagram of a selection element in the semiconductor memory device according to the same embodiment.
Figure 5B:
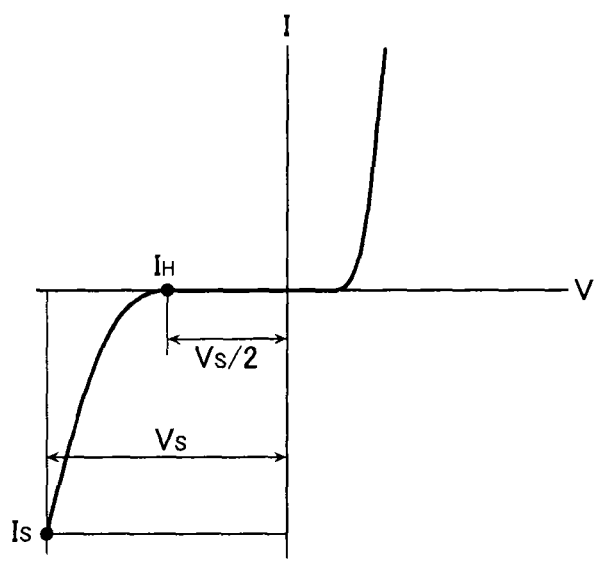
FIG. 5B is a characteristic diagram of the selection element in the semiconductor memory device according to the same embodiment.

As previously mentioned, as a result of the variable resistance element VR being a bipolar operation element, the selection element S must have characteristics of allowing a certain current of both positive and negative polarities to flow as shown in FIGS. 5A and 5B. Therefore, a diode with large reverse direction leakage current, tunnel element, or the like is employed as the selection element S.

The most important parameter as a characteristic of the selection element S is a half-selected cell current $I_H$. The half-selected cell current $I_H$ herein refers to a current flowing in the memory cell MC when a voltage $V_S/2$ is applied to the memory cell MC, where a current required in the setting operation/resetting operation of the variable resistance element VR is assumed to be a selected cell current $I_S$, and a voltage applied to the memory cell MC to cause this selected cell current $I_S$ to flow is assumed to be $V_S$ (selected voltage). Below, for convenience, a ratio of the selected cell current $I_S$ to the half-selected cell current $I_H$ is defined as k, and this k is assumed to be a characteristic parameter of the selection element S. Moreover, a memory cell MC applied with the voltage $V_S/2$ is called a "half-selected cell".

Note that, strictly speaking, the memory cell MC is configured by the variable resistance element VR and the selection element S connected in series, hence, in order to be employed in an array operation to be described later, must be corrected according to voltage distributions of these two elements.

Next, a size and bias state during data erase/write/read of the memory cell array 11 in the semiconductor memory device according to the present embodiment are described with reference to FIG. 6.

The memory cell array 11 in the present embodiment has an array size of M×N, and a relationship $M^2<2Nk$ satisfied between these M and N. In particular, in the present embodiment, as shown in FIG. 6, when 2Nk is sufficiently larger than $M^2$ ($M^2<<2Nk$), advantages of the present embodiment may be more greatly obtained. Therefore, described below is the case where $M^2<<2Nk$ is satisfied, for example, the case where M=1K and N=16K, and so on. Now, k is a previously mentioned characteristic parameter of the selection element S. Moreover, the unselected word line voltage VUW and selected bit line voltage VSB both equal a certain voltage V.

Figures 6, 7:
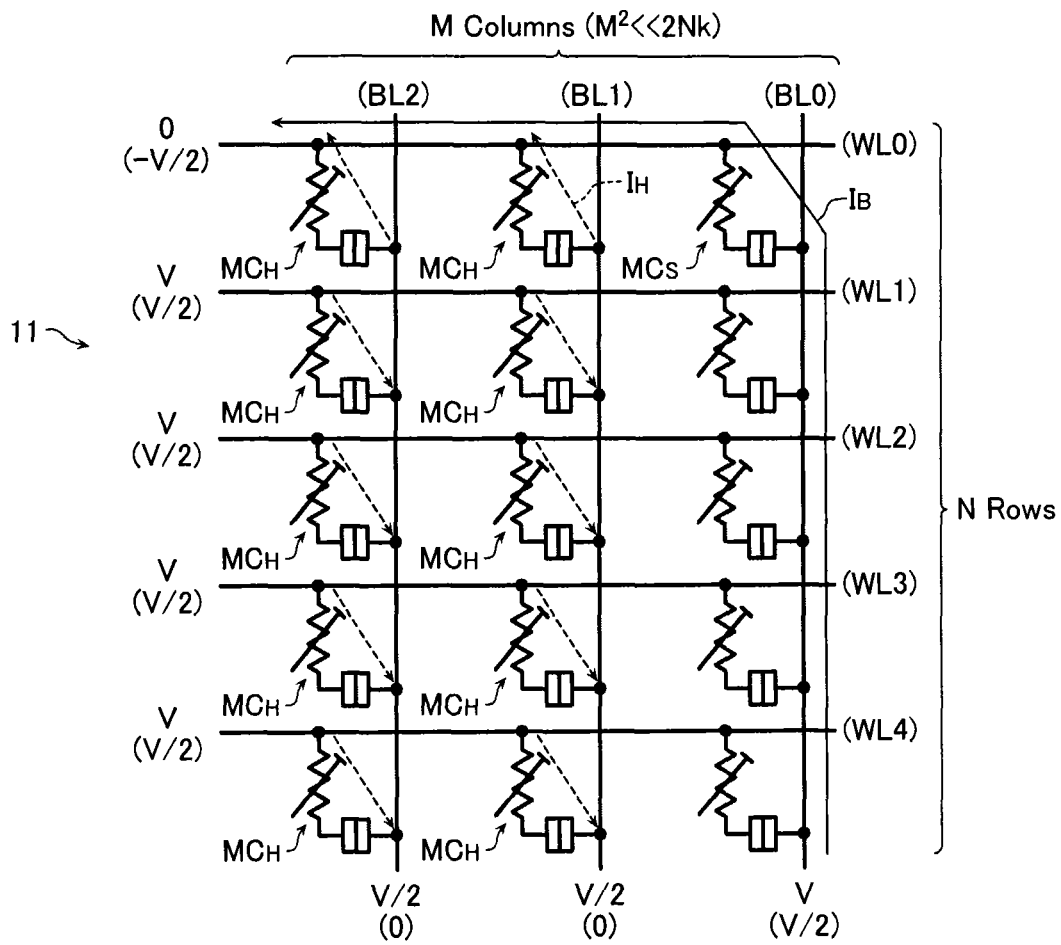
FIG. 6 is a view explaining a circuit and bias states of the memory cell array in the semiconductor memory device according to the same embodiment.
FIG. 7 is a table showing effects due to scaling of various kinds of parameters of the memory cell array in the semiconductor memory device according to the same embodiment.
Figure 21:
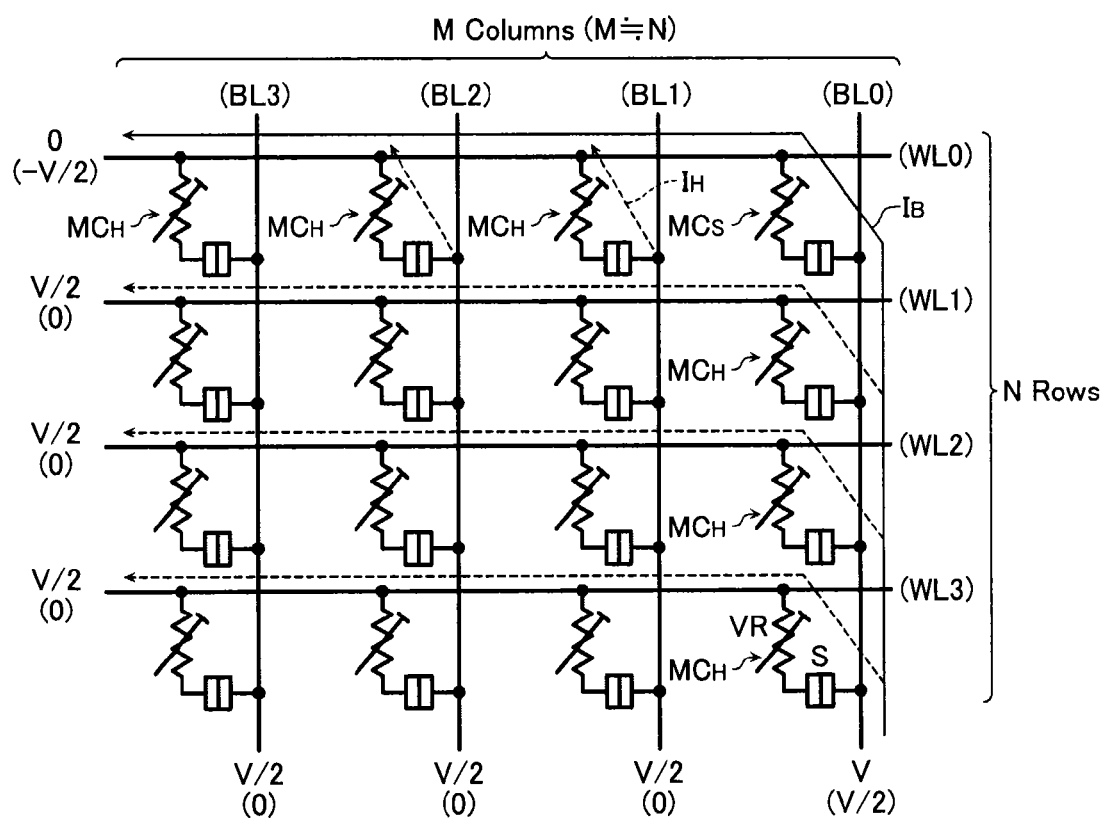
FIG. 21 is a view explaining a circuit and bias states of a memory cell array in a semiconductor memory device according to a comparative example.

In the present embodiment, setting the array size and bias state of the memory cell array 11 as in FIG. 6 makes reduction scaling of the memory cell array 11 easier, and to help this point to be understood, the case is described of a memory cell array shown in a comparative example shown in FIG. 21. As an example, FIG. 21 shows the bias state in the case where the word line WL0 is assumed to be the selected word line, the bit line BL0 is assumed to be the selected bit line, and the memory cell $MC_S$ connected to the intersection of these word line WL0 and bit line BL0 is assumed to be the selected cell.

The memory cell array according to this comparative example has an array size M×N, where normally M and N are approximately equal. In addition, the unselected word line voltage VUW and unselected bit line voltage VUB are both V/2, and set to an intermediate voltage of the selected word line voltage VSW and selected bit line voltage VSB.

In this case, a selected bit line current $I_B$ shown by the solid line arrow in FIG. 21 flows in the selected bit line BL0. In addition, when no account is taken of voltage drop, memory cells connected to the selected word line WL0 or selected bit line BL0 and distinct from the selected cell $MC_S$ become half-selected cells $MC_H$ applied with a bias of V/2. A half-selected cell current $I_H$ shown by the broken line arrows in FIG. 21 flows in these half-selected cells $MC_H$.

When actually performing an array operation, it becomes important to apply the desired voltage $V_S$ to the selected cell $MC_S$, compensating for the voltage drop resulting from wiring in the memory cell array, and, in the case of FIG. 21, voltage drop BL_IR and WL_IR of the selected bit line BL0 and selected word line WL have, as a maximum, values shown in expressions (1) and (2), respectively:

$$BL\_IR = I_S(2N\beta) + \tfrac{1}{2}NI_H(2N\rho) \qquad (1)$$

$$WL\_IR = I_S(2M\rho) + \tfrac{1}{2}MI_H(2M\rho) \qquad (2)$$

where ρ is a sheet resistance of the bit line BL and the word line WL.

The case is now considered of performing reduction scaling of a size of a system with a scaling coefficient λ at constant current density. This scaling coefficient λ has a value that is smaller the more reduced is the size of the system. In this case, the various parameters of the memory cell array change as shown in the table of FIG. 7. Thus, upon consideration of the scaling coefficient λ and setting $I_H=I_S/k$, expressions (3) and (4) are respectively obtained from expressions (1) and (2).

$$\text{BL\_IR} = I_S(2N\rho) + \frac{1}{2}\frac{NI_S}{k}(2N\rho)\frac{1}{\lambda} \tag{3}$$

$$\text{WL\_IR} = I_S(2M\rho) + \frac{1}{2}\frac{MI_S}{k}(2M\rho)\frac{1}{\lambda} \tag{4}$$

Looking at expressions (3) and (4), neither of the first terms on the right-hand side of each depends on λ, hence, even if reduction scaling is performed, a constant voltage drop can be maintained. On the other hand, the second terms on the right-hand side are both proportional to 1/λ, hence it is clear that if the system is reduced, the voltage drop increases.

Similarly, if the proportion of the selected bit line current $I_B$ flowing in the column decoder 13 taken up by the selected cell current $I_S$ when performing read of the cell current from the column decoder 13 side is defined as READ signal rate, then its scaling dependency is given by the following expression (5).

$$\text{READ signal ratio} = \frac{I_S}{I_S + NI_H} = \frac{1}{1 + \frac{N}{k\lambda}} \tag{5}$$

It is clear from expression (5) that the READ signal ratio also does not become constant during reduction scaling and if the system is scaled down the proportion of the half-selected cell current $I_H$ increases whereby detection of the selected cell current $I_S$ becomes difficult.

In contrast, in the present embodiment shown in FIG. 6, a bias voltage of the unselected word line WL1 and so on is brought closer to a bias voltage of the selected bit line BL0, hence the half-selected cell current $I_H$ does not get mixed in with the selected bit line current $I_B$. Therefore, the voltage drop of the selected bit line BL0 achieves a constant value given by expression (6), even if reduction scaling is performed.

$$\text{BL\_IR} = I_C(2N\rho) \tag{6}$$

On the other hand, the voltage drop of the selected word line WL0 is given by the following expression (7) which is mathematically similar to the case of the comparative example.

$$\text{WL\_IR} = I_S(2M\rho) + \frac{1}{2}\frac{MI_S}{k}(2M\rho)\frac{1}{\lambda} \tag{7}$$

However, as previously mentioned, when the array size is determined so as to satisfy $M^2<2Nk$, the second term on the right-hand side of expression (7) is sufficiently smaller than the value of expression (6) and in effect may be ignored. As a result, only the first term on the right-hand side of expression (7) is valid and the voltage drop WL_IR of the selected word line WL0 effectively attains a constant value even if reduction scaling is performed.

Note that in the estimate of expression (6), it must be assumed that the voltage drop of the unselected word line WL1 and so on is sufficiently small. However, the second term on the right-hand side of expression (7) and the voltage drop of the unselected word line WL1 and so on are given by an identical mathematical expression, hence, when $M^2 \ll 2Nk$ is satisfied, this assumption is also satisfied.

Furthermore, in the present embodiment, as previously mentioned, there is no half-selected cell current $I_H$ mixed into the selected bit line current $I_B$, hence the READ signal ratio is constantly 1 and is never reduced even if reduction scaling is performed.

As is clear from the above, making the array size nonsymmetrical vertically and horizontally and bringing the bias voltage of the selected bit line BL closer to the bias voltage of the unselected word line WL allows the voltage drop to in effect be maintained at a constant value during reduction scaling. Furthermore, the signal ratio of the read target selected cell current $I_S$ can also be maintained at a constant value.

Specifically, for example, when configuring the memory cell array 11 by one bit per cell memory cells MC and allocating 16M bits of storage capacity to one memory cell array 11, if it is assumed that M=1K and N=16K, then $M^2$=1M and 2N=32K. In this case, provided the parameter k of the selection element S is about 1000 or more, then in the first generation $M^2/2Nk=\frac{1}{32}$, and even after the third generation $M^2/2Nk<\frac{1}{11}$, whereby a ratio having a size of one digit or more can be secured. In addition, in the case where the selection element S is a linear element, then k=2, but even in this case, if it is assumed that M=128 and N=256K, then in the first generation $M^2/2Nk=\frac{1}{32}$, whereby a ratio of one digit or more can be secured similarly to the previous example.

Furthermore, in order to allocate a large storage capacity to an identical chip area, a stacking structure may be adopted in which L layers of M×N memory cell arrays are stacked in a direction perpendicular to the substrate (Z direction). In this case, connection to each of the bit lines BL must be performed on a one by one basis, but connection to the word lines WL may for example be configured commonly in even-numbered memory cell arrays 11 and odd-numbered memory cell arrays 11, respectively.

That concludes description of the case where M=1K and N=16K as an example satisfying $M^2 \ll 2Nk$. It is now described generally to what degree it is desirable for 2Nk to be larger than $M^2$.

In this description, "(right-hand side)-(left-hand side)" per unit bit line length is introduced as an evaluation function with respect to the inequality $M^2 \ll 2Nk$, and this evaluation function is described as f. In addition, (M, N, x) are adopted as independent variables in place of the group (M, N, k), (where $x=M^2/2Nk$). In this case, f may be expressed as in expression (8).

$$f = \frac{M^2}{N}\left(\frac{1}{x} - 1\right) \tag{8}$$

Figure 9:
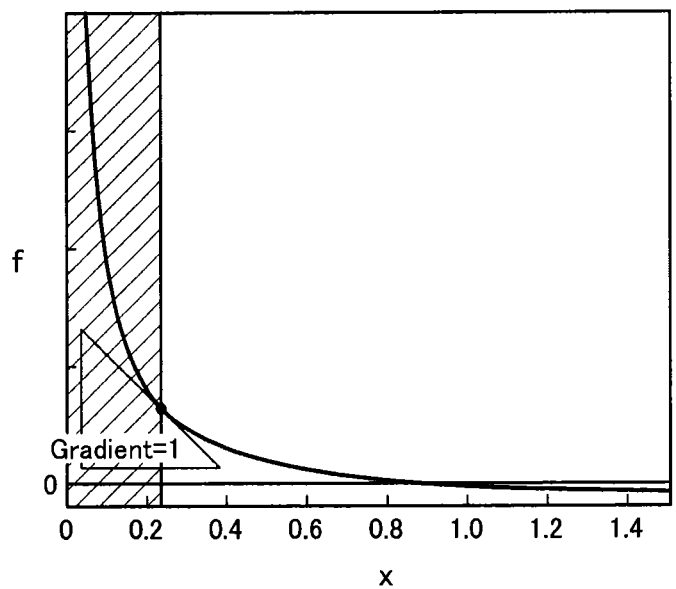
FIG. 9 is a view explaining selection conditions of size of the memory cell array in the semiconductor memory device according to the same embodiment.

FIG. 9 displays expression (8) as a graph. As is clear from FIG. 9, when (an absolute value of) a gradient of function f exceeds 1, f increases rapidly (shaded region shown in FIG. 9), hence the evaluation function may be regarded as being sufficiently large. Conditions that the gradient of function f are greater than 1 are as in expression (9).

$$\left|\frac{\partial f}{\partial x}\right| = \frac{M^2}{N}\left(\frac{1}{x^2}\right) > 1 \tag{9}$$

From the above, conditions of desirable size of 2Nk with respect to $M^2$ may be expressed as in expression (10), $$x < \frac{M}{\sqrt{N}} \tag{10}$$

although it should be noted that f>0 in all cases hence x<1 must be satisfied, regardless of expression (10).

Note that the bias states shown in FIGS. 6 and 21 are simply examples, and only relative values of voltages between each of the electrodes is significant. Therefore, for example, the combination (+V/2, 0, −V/2) may also be employed in place of the combination (V, +V/2, 0), by subtracting V/2 overall as shown in brackets in FIGS. 6 and 21. Although in this case, a circuit for generating negative voltages becomes necessary, there are advantages that the maximum voltage to be supplied by the circuit can be reduced, hence breakdown voltage of the CMOS circuit can be reduced and occupied area of the CMOS circuit portion can be reduced.

As described above, the present embodiment allows voltage drop in the wiring to be in effect maintained constant, and, furthermore, READ signal ratio in the wiring to be in effect maintained constant, even when reduction scaling of cell size is performed. Therefore, the present embodiment can provide a semiconductor memory device in which reduction scaling can be easily performed without the need to consider voltage drop and READ signal ratio.

Second Embodiment

A semiconductor memory device according to a second embodiment differs from the semiconductor memory device according to the first embodiment mainly in a structure of a portion corresponding to the memory cell unit 54 shown in FIG. 1. Accordingly, the semiconductor memory device according to the present embodiment is described below focusing on the difference with the semiconductor memory device according to the first embodiment.

Figure 10:
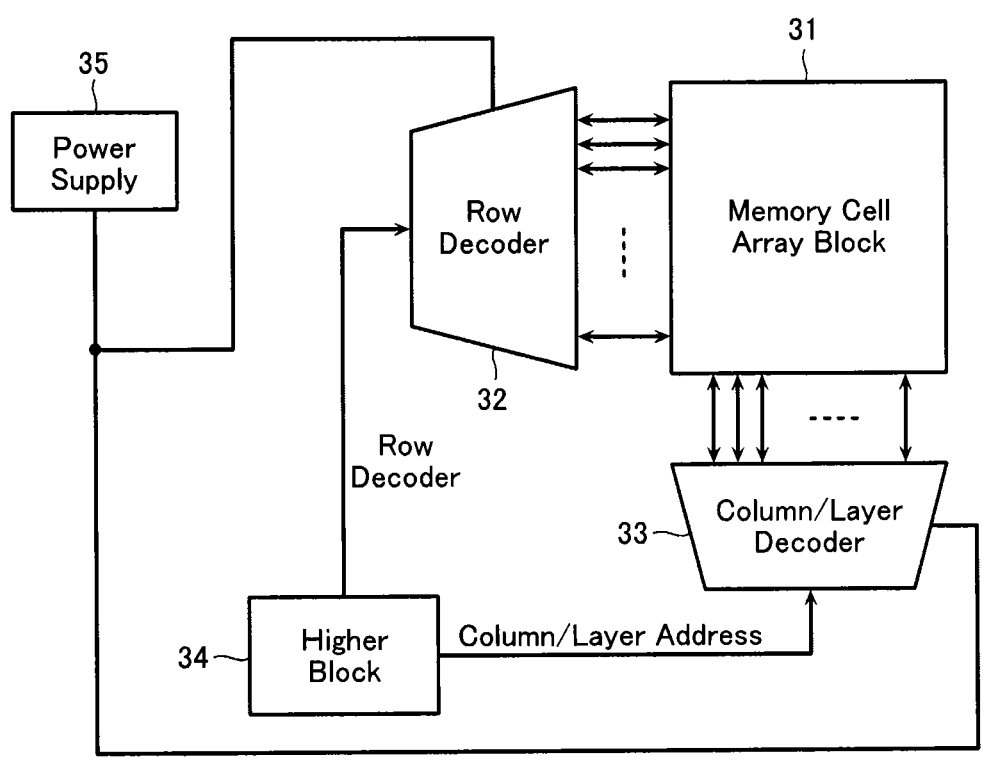
FIG. 10 is a functional block diagram of a semiconductor memory device according to a second embodiment.

FIG. 10 is a view showing functional blocks of the semiconductor memory device according to the present embodiment.

The semiconductor memory device according to the present embodiment comprises a memory cell array block 31, a column/layer decoder 33, and a higher block 34 in place of, respectively, the memory cell array 11, the column decoder 13, and the higher block 14, but otherwise comprises similar functional blocks to those of the semiconductor memory device according to the first embodiment.

The memory cell array block 31 is configured having a plurality of memory cell arrays stacked, each of the memory cell arrays including a plurality of word lines and bit lines that intersect one another and memory cells provided at each of intersections of the word lines and bit lines.

The column/layer decoder 33 which includes a driver having a data erase/write/read function is connected to each of the bit lines BL in the memory cell array block 31. This column/layer decoder 33 selects a specific memory cell array in the memory cell array block 31 based on a column/layer address outputted from the higher block 34, and supplies the selected bit line voltage VSB or the unselected bit line voltage VUB to bit lines of this memory cell array.

Next, each of the memory cell arrays in the memory cell array block 31 is described.

Figure 11:
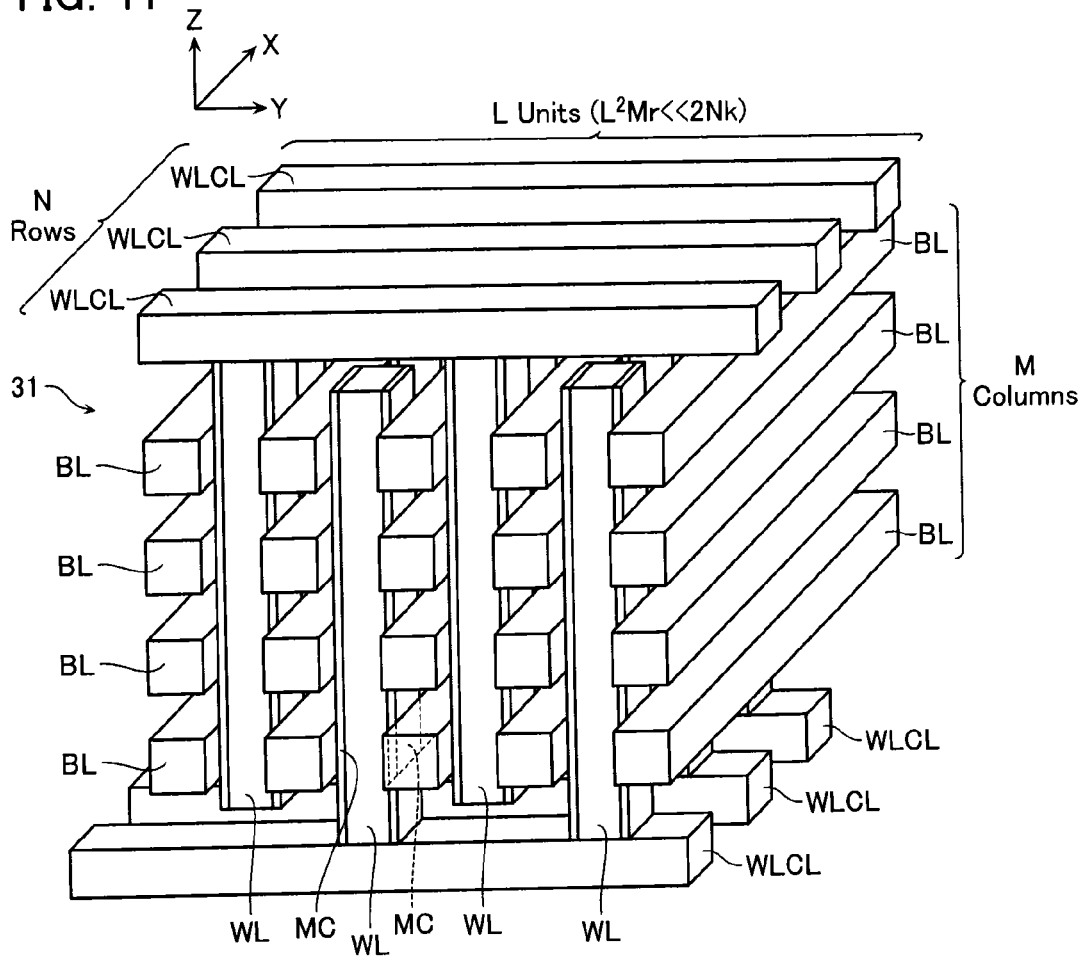
FIG. 11 is a perspective view showing a structure of a memory cell array block in the semiconductor memory device according to the same embodiment.

FIG. 11 is a perspective view showing part of the memory cell array block 31. The X direction, Y direction, and Z direction in FIG. 11 are identical to, respectively, the X direction, Y direction, and Z direction shown in FIG. 1.

As shown in FIG. 11, the memory cell array block 31 is configured by a plurality of memory cell arrays stacked with a certain pitch in the Y direction.

Each of the memory cell arrays in the memory cell array block 31 includes a plurality of bit lines BL arranged in a Z-X plane to extend in the X direction and having a certain pitch in the Z direction, a plurality of column-shaped word lines WL arranged in the Z-X plane to extend in the Z direction and having a certain pitch in the X direction, and memory cells MC provided at each of intersections of these bit lines BL and word lines WL. Now, the number M of bit lines BL and the number N of word lines WL arranged in each of the memory cell arrays has the relationship of $M^2 < 2Nk$, similarly to the memory cell array 11 according to the first embodiment. In particular, the fact that a greater advantage can be obtained in the present embodiment when Nk is sufficiently larger than $M^2$ ($M^2 << 2Nk$) is similar to in the first embodiment. Note that the word lines WL and bit lines BL are shared by two memory cell arrays adjacent in the Y direction.

In addition, fellow word lines WL in odd-numbered memory cell arrays are commonly connected by word line connecting lines WLCL (row line connecting lines) arranged in an X-Y plane to extend in the Y direction and having a certain pitch in the X direction. Similarly, fellow word lines WL in even-numbered memory cell arrays are also commonly connected by word line connecting lines WLCL.

Configuring a word line WL direction in the memory cell array as the Z direction in this way allows an arrangement direction of the bit lines BL to be matched to a perpendicular direction to the silicon substrate which is most difficult for repeated formation, thereby allowing optimization of the chip overall to be achieved.

Note that in the case of the second embodiment, the word lines WL are commonly connected by the word line connecting line WLCL, hence consideration must be given not only to voltage drop in the bit lines BL and word lines WL, but also to voltage drop in the word line connecting line WLCL. However, the word line connecting line WLCL may be disposed at an outer edge of the memory cell array block 31, hence sheet resistance can be reduced by a means such as increasing a film thickness. As a result, effects due to the word line connecting line WLCL can be reduced.

In the case of the semiconductor memory device according to the second embodiment, if a ratio of a sheet resistance of the bit line BL to a sheet resistance of the word line connecting line WLCL is defined to be r, and the relationship $L^2 Mr < 2Nk$ is satisfied in addition to the relationship $M^2 < 2Nk$ required in the first embodiment, voltage drop due to the half-selected cell current $I_H$ can be reduced. Particularly in the case where the relationship $M^2 << 2Nk$ is satisfied, and, furthermore, the relationship $L^2 Mr << 2Nk$ is satisfied, voltage drop due to the half-selected cell current $I_H$ may be ignored.

The second embodiment not only allows reduction scaling to be easily performed similarly to in the first embodiment but also allows an even higher degree of integration to be achieved than in the first embodiment.

Figure 8:
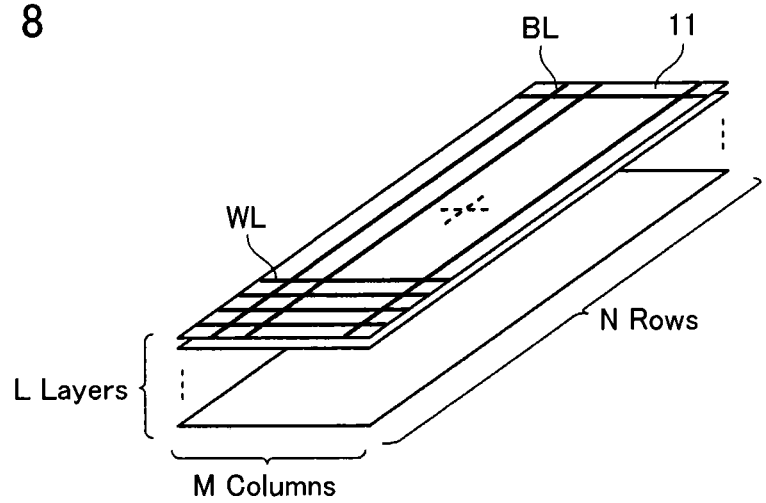
FIG. 8 is a perspective view showing a structure of a memory cell unit in the semiconductor memory device according to the same embodiment.

For example, if a semiconductor memory device in the first embodiment shown in FIG. 8 is assumed to be configured having M=1K, N=16K and L=8, and it is desired to realize a semiconductor memory device having the same storage capacity, the same area, and the same voltage drop as this by the semiconductor memory device according to the second embodiment shown in FIG. 11, it is only required to configure that sheet resistance ratio r=0.25, M=8, N=16K and L=512.

This is because, in the case of the second embodiment shown in FIG. 11, the memory cells MC can be provided on both sides of each of the bit lines BL and each of the word lines WL. Moreover, in the case of employing a memory cell array block 31 thus configured, bringing the unselected word line voltage VUW closer to the selected bit line voltage VSB allows voltage drop due to the half-selected cell current $I_H$ to be ignored similarly to in the first embodiment.

Next, manufacturing processes of the memory cell array block 31 are described with reference to FIGS. 12-20.

Figure 12:
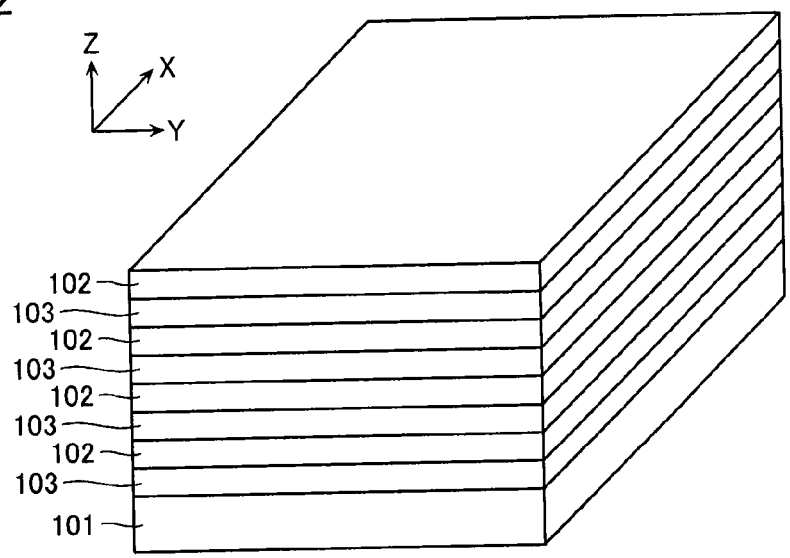
FIG. 12 is a view explaining a method of manufacturing the memory cell array block in the semiconductor memory device according to the same embodiment.

First, as shown in FIG. 12, a CVD method is employed to stack, alternately, on one side of a silicon substrate 101 (semiconductor substrate), an interlayer insulating film 103 configured from $SiO_2$ and a silicon (Si) film 102 including a high concentration impurity. Upon completion of subsequent processing steps, this silicon film 102 becomes the bit lines BL shown in FIG. 11. As a result, the same number of layers of the silicon film 102 are stacked as there are bit lines BL formed in the Z direction perpendicular to the silicon substrate 101 (4 layers in FIG. 11).

Figure 13:
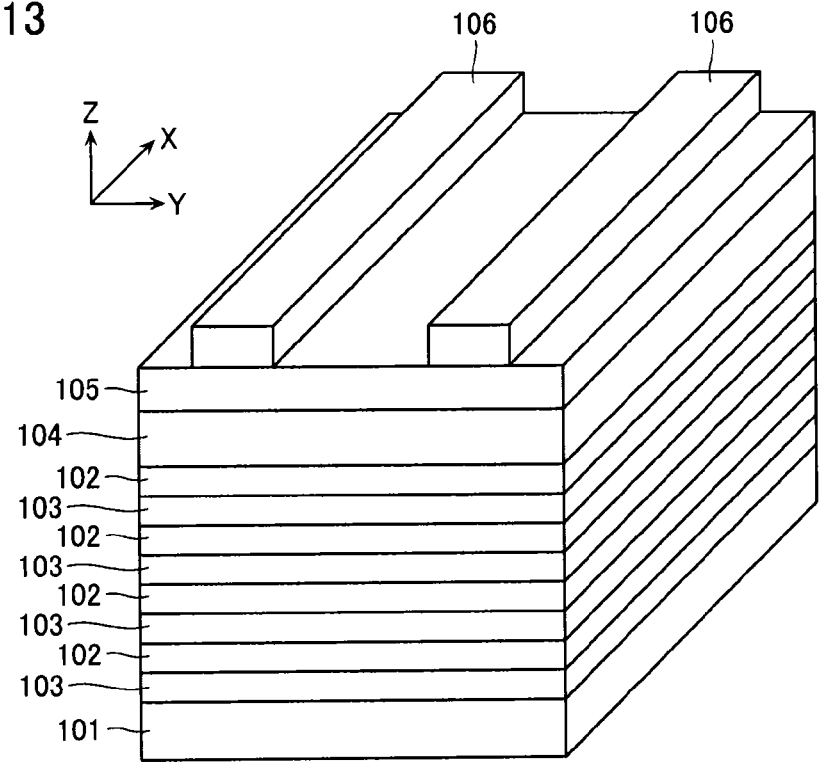
FIG. 13 is a view explaining the method of manufacturing the memory cell array block in the semiconductor memory device according to the same embodiment.

Then, as shown in FIG. 13, an etching mask 106 is stacked via an insulating film 104 and an insulating film 105. A resist pattern in formed on the etching mask 106 using a photo etching process. The etching mask 106 undergoes patterning by reactive ion etching with this resist pattern acting as a mask. The etching mask 106 is formed extending in the X direction and arranged in a plurality of lines in the Y direction.

Figure 14:
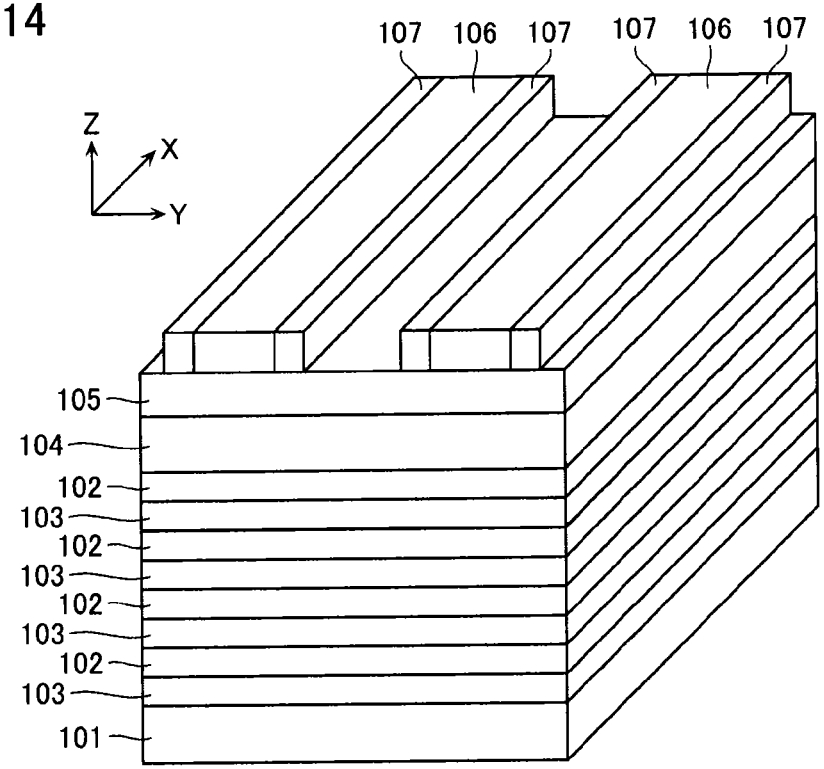
FIG. 14 is a view explaining the method of manufacturing the memory cell array block in the semiconductor memory device according to the same embodiment.

Subsequently, as shown in FIG. 14, a mask material is deposited on the insulating film 105 and the etching mask 106, then etching is performed. As a result of this etching, a side wall mask 107 extending along a Y direction side wall of the etching mask 106 is formed.

Figure 15:
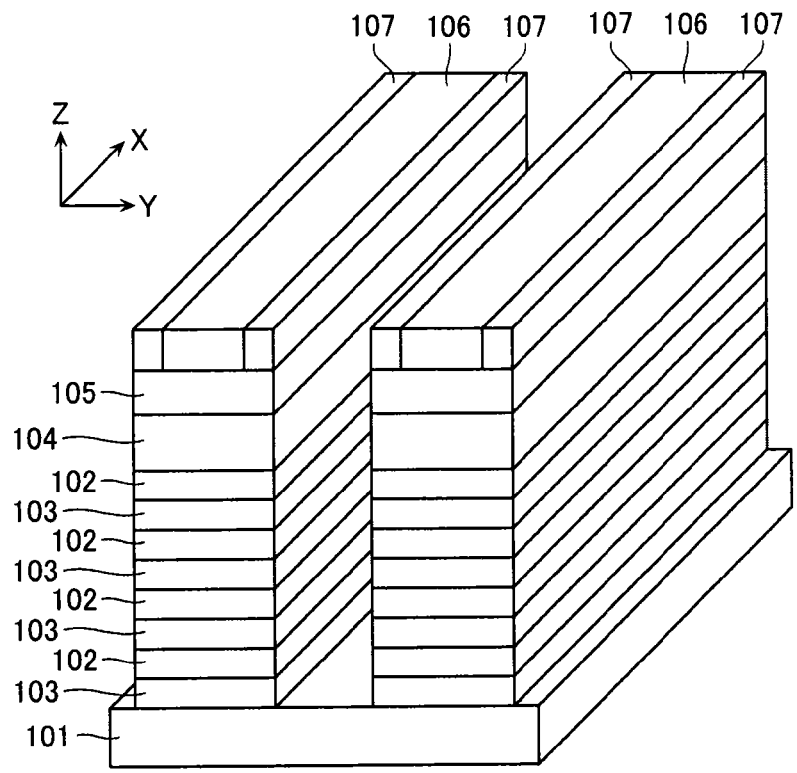
FIG. 15 is a view explaining the method of manufacturing the memory cell array block in the semiconductor memory device according to the same embodiment.

Then, as shown in FIG. 15, the interlayer insulating film 103 and the silicon film 102 are etched by reactive ion etching with the etching mask 106 and the side wall mask 107 acting as a mask. This etching is performed until the silicon substrate 101 is reached and a surface of the silicon substrate 101 is exposed.

Figure 16:
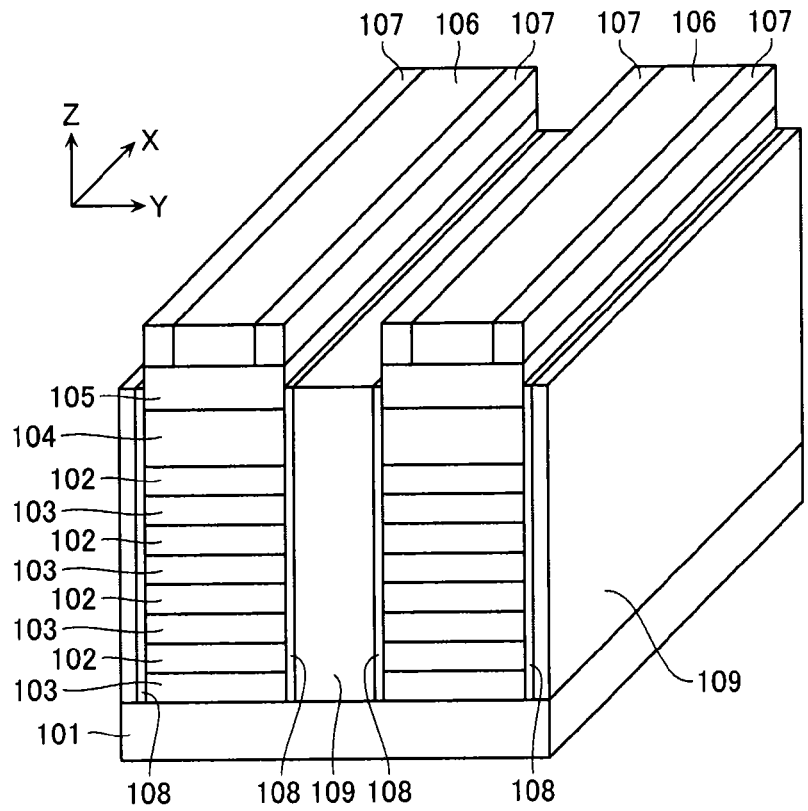
FIG. 16 is a view explaining the method of manufacturing the memory cell array block in the semiconductor memory device according to the same embodiment.

Subsequently, as shown in FIG. 16, a resistance varying material 108 is formed on a side surface of the silicon film 102 exposed by the etching. Then, a silicon (Si) film 109 including a high concentration impurity is deposited to fill in between the resistance varying material 108. Upon completion of subsequent processing steps, this silicon film 109 becomes the word lines WL shown in FIG. 11. The silicon film 109 is connected to diffusion layer wiring (not illustrated) provided beforehand on the silicon substrate 101.

Figure 17:
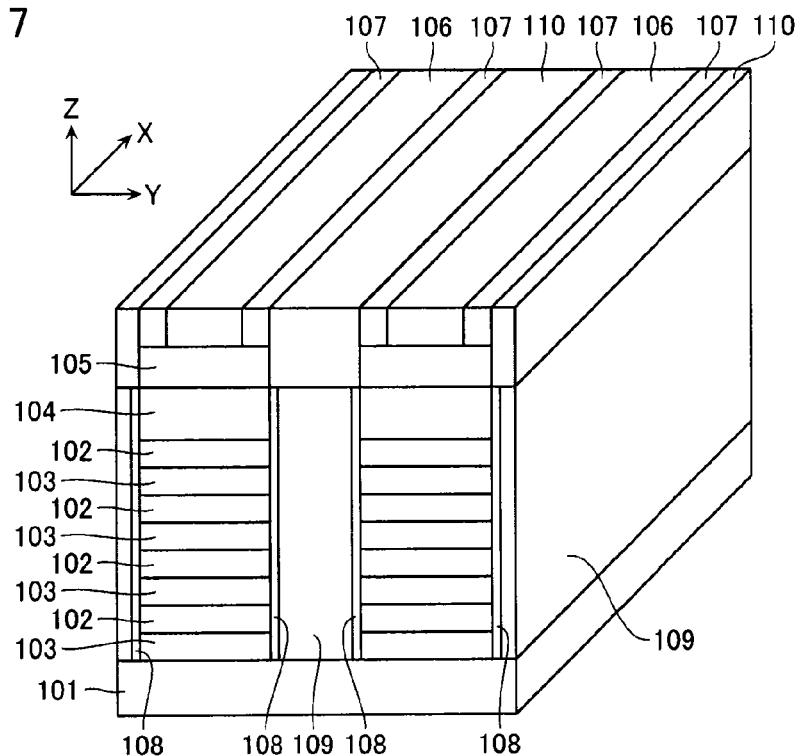
FIG. 17 is a view explaining the method of manufacturing the memory cell array block in the semiconductor memory device according to the same embodiment.

Subsequently, as shown in FIG. 17, an etching mask 110 for use in a later etching process is deposited on the resistance varying material 108 and the silicon film 109. Then, the etching mask 110, the etching mask 106, and the side wall mask 107 are planarized by CMP (Chemical Mechanical Polishing).

Figure 18:
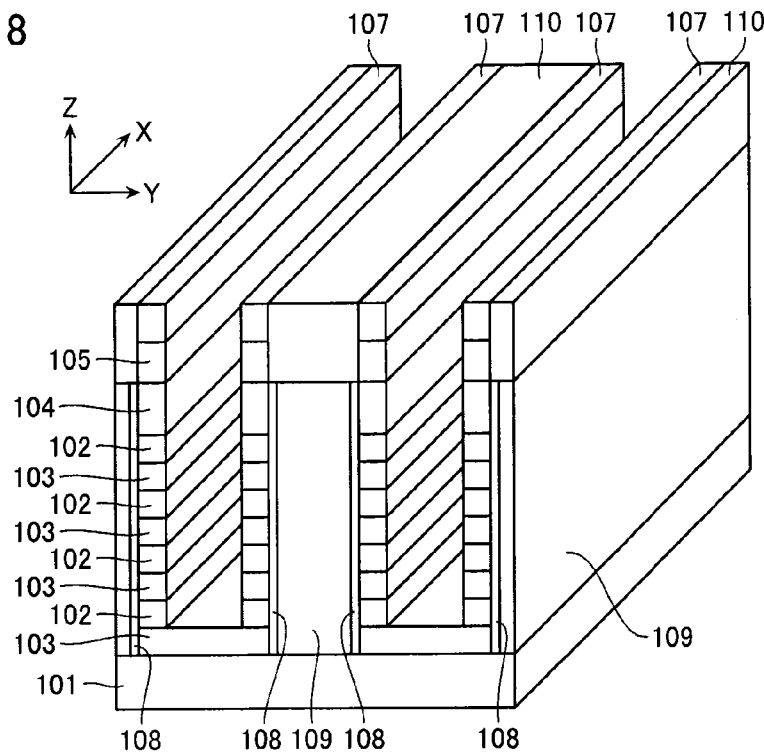
FIG. 18 is a view explaining the method of manufacturing the memory cell array block in the semiconductor memory device according to the same embodiment.

Next, as shown in FIG. 18, the etching mask 106 only is removed. Subsequently, the interlayer insulating film 103 and the silicon film 102 are etched by reactive ion etching with the etching mask 110 and the side wall mask 107 acting as a mask. This etching is performed so as not to reach the silicon substrate 101, that is, the etching allows the interlayer insulating layer 103 to remain.

Figure 19:
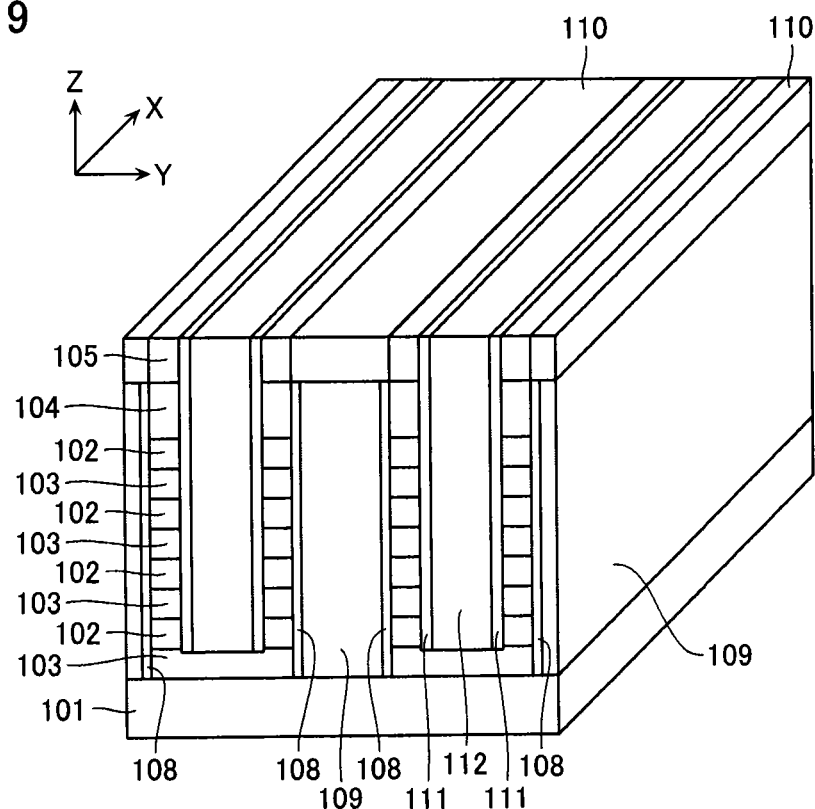
FIG. 19 is a view explaining the method of manufacturing the memory cell array block in the semiconductor memory device according to the same embodiment.

Subsequently, as shown in FIG. 19, a resistance varying material 111 is formed on a side surface of the silicon film 102 exposed by the etching. Then, a silicon (Si) film 112 including a high concentration impurity is deposited to fill in between the resistance varying material 111. Upon completion of subsequent processing steps, this silicon film 112 becomes the word lines WL shown in FIG. 11. The silicon film 112 is insulated and isolated from the silicon substrate 101 on which the diffusion layer wiring is formed, by a lowermost layer of the interlayer insulating film 103. Then, CMP is used to planarize the silicon film 112 and remove the etching mask 107.

Figure 20:
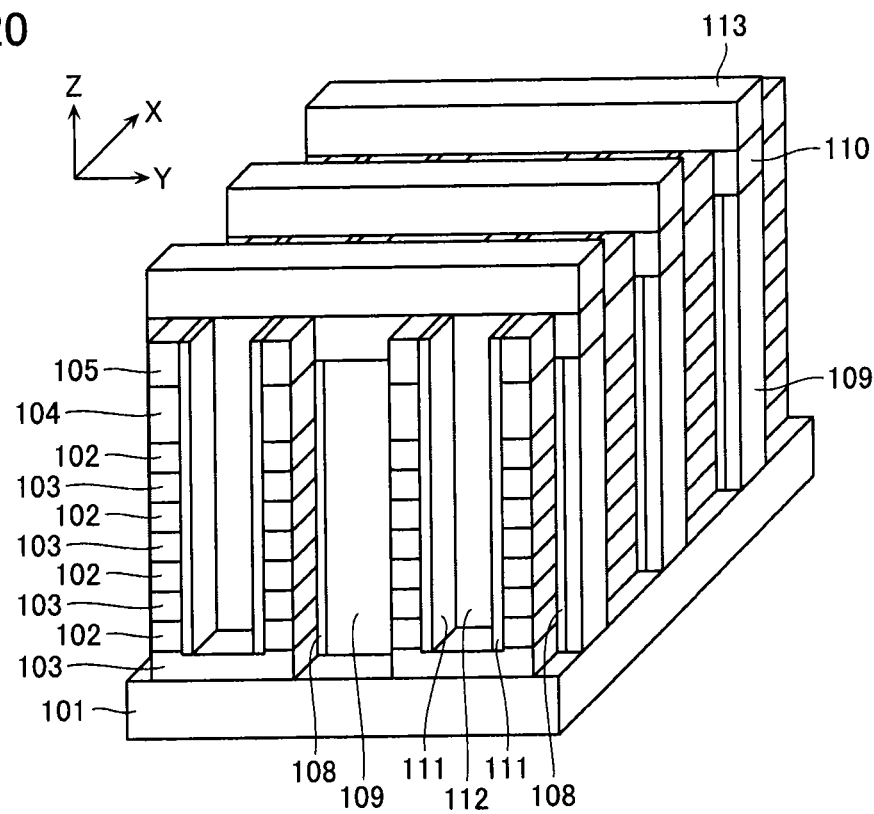
FIG. 20 is a view explaining the method of manufacturing the memory cell array block in the semiconductor memory device according to the same embodiment.

Finally, as shown in FIG. 20, a metal film and an etching mask are deposited on all surfaces, then a photo etching process is employed to form a resist pattern on the etching mask. The etching mask undergoes patterning by reactive ion etching with this resist pattern acting as a mask. The etching mask is formed extending in the Y direction and arranged in a plurality of lines in the X direction. The metal film and the silicon film are etched by reactive ion etching with this etching mask acting as a mask. This etching causes the silicon film to be separated into a plurality of word lines WL aligned in the X direction. Moreover, etched metal wiring 113 becomes the word line connecting line WLCL shown in FIG. 11. Note that the metal wiring 113 is insulated and isolated from the silicon film 109 by the etching mask 110.

The above processes enable the semiconductor memory device shown in FIG. 11 to be manufactured. A photo etching process is performed twice in the above-mentioned method of manufacturing, thereby allowing any rise in lithography processing costs to be suppressed. In addition, the silicon film 109 (word line WL) and the silicon film 112 (word line WL) formed alternately between the silicon film 102 (bit line BL) are formed in an opening etched with the etching masks 106 and 110 formed alternately between the side wall mask 107 acting as a mask. If the photo etching process is performed a plurality of times when manufacturing the word lines WL, it is easy for misalignment to occur, leading to a risk of variation in performance of the manufactured word lines WL, memory cells MC, and so on. However, the above-mentioned method of manufacturing has alignment of word lines WL performed without removing the side wall mask 107, hence enables misalignment, variation in line width, and so on, to be suppressed.

As described above, the present embodiment makes it possible to provide a semiconductor memory device which not only enables similar advantages to those of the first embodiment to be obtained but also allows an even higher degree of integration to be achieved than in the first embodiment.

[Other]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a semiconductor substrate having as a principal plane a plane extending in an X direction and a Y direction, the X direction and the Y direction being two of three directions, namely the X direction, the Y direction and a Z direction that intersect one another;
   a memory cell array block formed on the semiconductor substrate and including a plurality of memory cell arrays and a plurality of row line connecting lines, each of the memory cell arrays being configured from a plurality of row lines arranged in the X direction and extending in the Z direction, a plurality of column lines arranged in the Z direction and extending in the X direction, and a plurality of memory cells disposed at each of intersections of the plurality of row lines and column lines and each including a variable resistance element, and the row line connecting lines being arranged in the X direction and extending in the Y direction and connecting between a row line of a certain one of the memory cell arrays and a row line of another of the memory cell arrays; and
   a decoder for applying to one of the memory cells a select voltage required in data erase/write/read, wherein, where a number of the row lines arranged in the X direction is assumed to be N, a number of the row lines arranged in the Y direction is assumed to be L, a number of the column lines arranged in the Z direction is assumed to be M, a ratio of a sheet resistance of the row line connecting lines to a sheet resistance of the column lines is assumed to be r, and a ratio of a cell current flowing in the one of the memory cells when the select voltage is applied to the one of the memory cells to a cell current flowing in the one of the memory cells when a voltage that is half of the select voltage is applied to the one of the memory cells is assumed to be k, relationships $M^2 < 2 \times N \times k$ and $L^2 \times M \times r < 2 \times N \times k$ are satisfied, and the variable resistance element is formed independently on each of two side surfaces facing the Y direction of side surfaces of the row line.

2. The semiconductor memory device according to claim 1, wherein each of the memory cells includes a selection element connected in series to the variable resistance element, the variable resistance element is configured from a material having a resistance state that changes irrespective of a polarity of the select voltage during data erase/write, and the select element allows a current to pass that changes the resistance state of the variable resistance element irrespective of the polarity of the select voltage during data erase/write.

3. The semiconductor memory device according to claim 1, wherein the decoder includes a row line decoder and a column line decoder, the row line decoder being configured to, when the decoder performs data erase/write/read to a selected cell from among the plurality of memory cells, supply a selected row line voltage to a selected row line from among the plurality of row lines that is connected to the selected cell and supply an unselected row line voltage to other unselected row lines, and the column line decoder being configured to, when the decoder performs data erase/write/read to the selected cell from among the plurality of memory cells, supply a selected column line voltage to a selected column line from among the plurality of column lines that is connected to the selected cell and supply an unselected column line voltage to other unselected column lines, the selected column line voltage having a potential difference of a select voltage portion with the selected row line voltage, and being substantively identical to the unselected row line voltage.

4. The semiconductor memory device according to claim 1, wherein a relationship $M^2/(2 \times N \times k) < M/(\sqrt{N})$ is satisfied.

5. The semiconductor memory device according to claim 3, wherein the unselected column line voltage is substantively half of the unselected row line voltage.

6. The semiconductor memory device according to claim 3, wherein the selected row line voltage and the selected column line voltage are voltages of different polarities.

7. The semiconductor memory device according to claim 1, wherein the row line connecting lines connect between the row lines of even-numbered memory cell arrays or between the row lines of odd-numbered memory cell arrays.

8. A semiconductor memory device, comprising:

a semiconductor substrate having as a principal plane a plane extending in an X direction and a Y direction, the X direction and the Y direction being two of three directions, namely the X direction, the Y direction and a Z direction that intersect one another;

a memory cell array block formed on the semiconductor substrate and including a plurality of memory cell arrays and a plurality of row line connecting lines, each of the memory cell arrays being configured from a plurality of row lines arranged in the X direction and extending in the Z direction, a plurality of column lines arranged in the Z direction and extending in the X direction, and a plurality of memory cells disposed at each of intersections of the plurality of row lines and column lines and each including a variable resistance element, and the row line connecting lines being arranged in the X direction and extending in the Y direction and connecting between a row line of a certain one of the memory cell arrays and a row line of another of the memory cell arrays; and a decoder for applying to one of the memory cells a select voltage required in data erase/write/read, wherein, where a number of the row lines arranged in the X direction is assumed to be N, a number of the column lines arranged in the Z direction is assumed to be M, and a ratio of a cell current flowing in the one of the memory cells when the select voltage is applied to the one of the memory cells to a cell current flowing in the one of the memory cells when a voltage that is half of the select voltage is applied to the one of the memory cells is assumed to be k, a relationship $M^2 < 2 \times N \times k$ is satisfied, and the variable resistance element is formed independently on each of two side surfaces facing the Y direction of side surfaces of the row line.

9. The semiconductor memory device according to claim 8, wherein each of the memory cells includes a selection element connected in series to the variable resistance element, the variable resistance element is configured from a material having a resistance state that changes irrespective of a polarity of the select voltage during data erase/write, and the select element allows a current to pass that changes the resistance state of the variable resistance element irrespective of the polarity of the select voltage in during data erase/write.

10. The semiconductor memory device according to claim 8, wherein the decoder includes a row line decoder and a column line decoder, the row line decoder being configured to, when the decoder performs data erase/write/read to a selected cell from among the plurality of memory cells, supply a selected row line voltage to a selected row line from among the plurality of row lines that is connected to the selected cell and supply an unselected row line voltage to other unselected row lines, and the column line decoder being configured to, when the decoder performs data erase/write/read to the selected cell from among the plurality of memory cells, supply a selected column line voltage to a selected column line from among the plurality of column lines that is connected to the selected cell and supply an unselected column line voltage to other unselected column lines, the selected column line voltage having a potential difference of a select voltage portion with the selected row line voltage, and being substantively identical to the unselected row line voltage.

11. The semiconductor memory device according to claim 8, wherein
a relationship $M^2/(2 \times N \times k) < M/(\sqrt{N})$ is satisfied.

12. The semiconductor memory device according to claim 10, wherein
the unselected column line voltage is substantively half of the unselected row line voltage.

13. The semiconductor memory device according to claim 10, wherein
the selected row line voltage and the selected column line voltage are voltages of different polarities.

14. The semiconductor memory device according to claim 8, wherein
the row line connecting lines connect between the row lines of even-numbered memory cell arrays or between the row lines of odd-numbered memory cell arrays.

15. A semiconductor memory device, comprising
a memory cell array block including:
a plurality of column line layers, each column line layer including a plurality of column lines;
a plurality of row lines arranged in rows and columns and interleaved with the column lines of said plurality of column line layers, such that a row of row lines is positioned between each consecutive pair of column lines in each column line layer;
a plurality of memory cell configured integrally between said column lines and each row line;
an upper row line connecting line layer having a first plurality of row line connecting lines; and
a lower row line connecting line layer having a second plurality of row line connecting lines,
wherein non-adjacent row lines in each column of row lines are electrically coupled to a row line connecting line in said upper row line connecting line layer and other non-adjacent row lines in each column of row lines are electrically coupled to a row line connecting line in said lower row line connecting line layer.

16. The semiconductor memory device according to claim 15, wherein each row line is coated in part by a memory cell, such that the memory cell of a given row line is disposed between the given row line and column lines that cross the given row line.

17. The semiconductor memory device according to claim 15, wherein
said memory cells comprise variable resistance elements that are non-volatile and re-writable.

18. The semiconductor memory device according to claim 15, wherein said memory cell array block has a unit memory cell footprint of $2F^2$, where F is the minimum feature size of the memory cell array block.

19. The semiconductor memory device according to claim 15, wherein
each memory cell is disposed between one of said row lines and the side wall of an adjacent one of said column lines.

20. A semiconductor memory device, comprising
a memory cell array block including:
a plurality of column line layers, each column line layer including a plurality of column lines;
a plurality of row lines arranged in rows and columns and interleaved with the column lines of said plurality of column line layers, such that a row of row lines is positioned between each consecutive pair of column lines in each column line layer;
a plurality of memory cell configured integrally between said column lines and each row line;
an upper row line connecting line layer having a first plurality of row line connecting lines; and
a lower row line connecting line layer having a second plurality of row line connecting lines,
wherein each row line is positioned between each consecutive pair of memory cells on each column line layer.

21. The semiconductor memory device according to claim 20, wherein
each memory cell is disposed between one of said row lines and the side wall of an adjacent one of said column lines.

* * * * *